United States Patent [19]
Kato et al.

[11] Patent Number: 5,789,763
[45] Date of Patent: Aug. 4, 1998

[54] SUBSTRATE FOR A DISPLAY DEVICE, A TFT DISPLAY ELEMENT USING THE SUBSTRATE

[75] Inventors: Naoki Kato; Masaya Kunigita, both of Yokohama, Japan

[73] Assignee: AG Technology Co., Ltd., Yokohama, Japan

[21] Appl. No.: 714,385

[22] Filed: Sep. 16, 1996

Related U.S. Application Data

[62] Division of Ser. No. 282,433, Jul. 29, 1994, Pat. No. 5,589,406.

[30] Foreign Application Priority Data

Jul. 30, 1993 [JP] Japan ................................ 5-208393

[51] Int. Cl.⁶ .................... H01L 29/04; H01L 29/76; H01L 31/036
[52] U.S. Cl. .................... 257/72; 257/59; 257/66; 257/69
[58] Field of Search ................ 257/59, 69, 72, 257/66

[56] References Cited

U.S. PATENT DOCUMENTS

| | | | |
|---|---|---|---|
| 4,554,539 | 11/1985 | Graves | 640/805 |
| 4,922,240 | 5/1990 | Duwaer | 340/784 |
| 5,426,447 | 6/1995 | Lee | 345/103 |
| 5,489,918 | 2/1996 | Mosier | 345/89 |
| 5,548,302 | 8/1996 | Kuwata et al. | 345/89 |
| 5,583,347 | 12/1996 | Misawa et al. | 257/72 |
| 5,583,366 | 12/1996 | Nakazawa | 257/40 |

Primary Examiner—Valencia Martin Wallace
Attorney, Agent, or Firm—Oblon, Spivak, McClelland, Maier, & Neustadt, P.C.

[57] ABSTRACT

A substrate for a display device wherein a plurality of row electrode lines and a plurality of column electrode lines are arranged in a matrix form on a substrate; pixel electrodes and pixel-drive-TFTs each having a polycrystalline semiconductor channel are provided so as to correspond to each intersection of the row electrode lines and the column electrode lines; the pixel-drive-TFTs are arranged in a line-like form in the direction of row electrode line; row signals are supplied through the row electrode lines to the pixel-drive-TFTs; and column signals are supplied through the column electrode lines to the pixel-drive-TFTs; a plurality of row driver circuits for supplying row signals are formed on the substrate so as to correspond to each of the row electrode lines; each of the row driver circuits has row-drive-TFTs; the row-drive-TFT has a polycrystalline semiconductor channel; and the row-drive-TFT is arranged in a line-like form in the direction of row electrode line with respect to the pixel-drive-TFTs for a single row electrode line.

11 Claims, 8 Drawing Sheets

SUBSTRATE FOR A DISPLAY DEVICE, A TFT DISPLAY ELEMENT USING THE SUBSTRATE

This is a Division of application Ser. No. 08/282,433 filed on Jul. 29, 1994, U.S. Pat. No. 5,589,406.

BACKGROUND OF THE INVENTION

1. Field of the Invention

The present invention relates to an arrangement of thin film transistors (TFTs) each having a polycrystalline semiconductor channel in a substrate for a display device having active elements (i.e., an active matrix display element, a thin film active element substrate or a TFT substrate), a TFT display element using the substrate and a method of making them.

2. Discussion of Background

Recently, there is a strong demand for flat panel displays for display devices instead of using CRTs. Among the flat panel displays, a liquid crystal display element (LCD) is considered to be most desirable. To meet demands of a color display and a high speed display, active matrix type LCDs utilizing TFTs are commercialized.

Generally, amorphous silicon ($\alpha$-Si) is used for a semiconductor layer for a TFT. However, use of polycrystalline Si instead of $\alpha$-Si allows to form a small-sized TFT, to obtain a high speed operation and to form a liquid crystal display device having a large picture displaying surface area and a high density because the mobility is high. Further, it is possible to simultaneously form driver circuits and TFTs for display device on a single substrate.

A method of forming a polycrystalline Si layer on a quartz substrate at a high temperature such as about 1000° C. or a method of forming the polycrystalline Si layer on a glass substrate at a low temperature such as 600° C. or lower have been known. In addition, there is known a method of obtaining polycrystalline Si by irradiating a laser beam spot to $\alpha$-Si and beam-annealing $\alpha$-Si under the condition of about room temperature.

In order to form a liquid crystal display element having a large picture area and a high performance with a high productivity, it is desirable to form a polycrystalline Si layer on an ordinary glass substrate for LCD (e.g. Corning 7059). In addition, a process of low temperature such as 600° C. or lower is needed. The above-mentioned beam-annealing method is desirable to achieve such requirements.

For the method of forming polycrystalline Si by beam-annealing, there is a first method wherein the entire surface area of a substrate or a portion of the substrate required to form a polycrystalline Si layer is beam-annealed without remaining non-annealed portion, and a second method wherein a portion unnecessary for the beam-annealing is omitted. In the former method, a laser beam excited by pulse oscillation and having a large irradiation surface area, such as an excimer laser, is widely used. In the later method, a laser beam of continuous oscillation such as an argon ion laser is widely used. The later method is preferable in a case that a high speed treatment is required and the throughput has to be improved.

There is statements concerning polycrystalline Si TFT liquid crystal panels in Nikkei Electronics, vol. 602 (Feb. 28, 1994), P. 103–109. The following is the summery of a statement described in P. 106–P. 107.

"Now, it is difficult for the beam anneal (laser beam anneal) method to uniformly control the mobility of the polycrystalline Si in the plane. Further, at present, there is no large aperture type laser device which can irradiate a substrate having a large surface area at once. Therefore, the large substrate is annealed by the scanning of a pulse laser having an aperture diameter of about 5 mm–10 mm. In this case, there is a problem that an overlapping portion is resulted in the laser treatment, and accordingly, there is an in-plane variation of about ±50% in terms of the mobility, which results in the variation of the characteristics of the TFTs.

As measures to the above problem, the speed of treatment is reduced to minimize the overlapping portion of polycrystalline Si. Or, variation in test products could be suppressed to about ±10% by conducting a plurality of laser treatments. A further problem for a large scale production, which has to be considered, is to increase the treating speed while ununiformity is controlled."

As a technique in the beam-annealing method, there is a high speed beam-annealing method using laser beam (HSBA) which is featurized by scanning beam spots at a high speed. For instance, the scanning is conducted with a laser output power of about 7 W–25 W and a linear speed for scanning of 10 m/s–20 m/s, preferably, 10 m/s–15 m/s, more preferably 11 m/s–13 m/s. As prior art techniques for forming polycrystalline Si TFTs by using the HSBA, there are those described in Japanese Unexamined Patent Publication No. 226039/1992 and Japanese Unexamined Patent Publication No. 226040/1992, (these applications are corresponding to U.S. Pat. No. 5,306,651). According to the HSBA, it is possible to polycrystallizing $\alpha$-Si at a process temperature of 450° C. or lower.

In the HSBA method, only portions forming silicon islands which become polycrystalline semiconductor active layers for TFTs are annealed by irradiating the laser beam. The remaining portions used for wiring and pixel electrodes are not subjected to the beam-annealing. For instance, when a TFT for displaying having polycrystalline Si is formed on a substrate with use of a scanning type beam annealing device, the scanning of the laser beam is conducted for irradiation at the same number of times as the number of the row electrode lines of a matrix which forms a picture surface.

As another conventional technique, there is Japanese Examined Patent Publication No. 9794/1993, which is featurized by laser-annealing only a non-single crystalline Si TFT in a peripheral driving circuit other than the pixel area of a LCD. For instance, a CW exciting YAG laser is used as a light source, and a light beam having a beam diameter of 200 µm is scanned at a linear speed of 50 cm/sec in the left and right directions so that only the portion of the peripheral driving circuit is processed by laser annealing.

In the above-mentioned conventional technique, there is description that the laser annealing to the entire surface of the substrate is not practical because the throughput in the manufacturing is very poor (due to a low linear speed). Accordingly, only the peripheral driving circuit is polycrystallized to form a polycrystalline semiconductor transistor. On the other hand, $\alpha$-Si is used for the pixel area. There is further description that when a peripheral circuit for a row electrode line and a peripheral circuit for a column electrode line are annealed, the substrate can be turned for the laser annealing. Further, there is statement on the performance of the LCD that the number of the both column electrode lines (data lines) and the row electrode lines (gate lines) are 200, and a polycrystalline semiconductor layer having a sufficient mobility and an operating speed required for the circuits have been able to attain.

In the next, the positional relation of the Si islands in the beam-annealing method will be described. FIG. 2 is a plane view showing a relation of the arrangement of Si islands 1 to polycrystallized stripes 2 in column driving circuits wherein the Si islands are not at sufficiently regulated positions. In order to anneal all the Si islands 1, it is necessary to conduct beam-anneal-scanning without remaining portions of scanning, which increases the number of times of scanning. As a result, it takes much time to conduct the beam-annealing of TFTs for column driving circuits, resulting in the reduction of the throughput.

In a case of making the above-mentioned substrate for a display device by using the beam-annealing method, it was difficult to beam-anneal TFTs for row driving circuits or column driving circuits which are provided at peripheral portions other than a region for pixels at the same time of the beam-annealing of TFTs for driving the pixels.

When the arrangement of the TFTs in the circuits at the peripheral portions of the substrate is not adequately made, it takes much time to beam-anneal these portions, whereby the throughput is reduced.

SUMMARY OF THE INVENTION

It is an object of the present invention to eliminate the above-mentioned disadvantages of the conventional techniques.

The main feature of the present invention is to arrange TFTs in peripheral circuits in a line-like form in the direction of row electrode line (or in the direction of column electrode line when replaceable) on a substrate for a display device wherein TFTs for driving pixels and the TFTs for the peripheral circuits are formed on the same and single substrate.

In the present invention, on a substrate on which TFTs for driving pixels which are composed of polycrystalline semiconductor, there are further driving circuits including TFTs which are composed of polycrystalline semiconductors. By using a method of arranging the TFTs for row driving circuits or column driving circuits on extension lines of the TFTs for displaying pixels, the TFTs for displaying pixels and the TFTs for either one of the row driving circuits and the column driving circuits can be simultaneously beam-annealed to form polycrystalline layers.

Then, the remaining TFTs for the column driving circuits or the row driving circuits are positioned so as to be in parallel to the direction of row electrode line or column electrode line. With such structure, steps of forming polycrystalline layers for the row driving circuits or the column driving circuits can be treated together at a high speed.

As a first embodiment of the present invention, there is provided a substrate for a display device wherein a plurality of row electrode lines and a plurality of column electrode lines are arranged in a matrix form on a substrate;

a pixel electrode and a pixel-drive-TFT having a polycrystalline semiconductor channel are provided so as to correspond to each intersection of the row electrode lines and the column electrode lines;

the pixel-drive-TFTs are arranged in a line-like form in at least the direction of row electrode line;

row signals are supplied through the row electrode lines to the pixel-drive-TFTs; and column signals are supplied through the column electrode lines to the pixel-drive-TFTs, the substrate being characterized in that a plurality of row driver circuits for supplying row signals are formed on the substrate so as to correspond to each of the row electrode lines;

each of the row driver circuits has at least one row-drive-TFT;

the row-drive-TFT has a polycrystalline semiconductor channel; and the row-drive-TFT is arranged in a line-like form in the direction of row electrode line with respect to the pixel-drive-TFTs for a single row electrode line.

As a second embodiment of the present invention, there is provided a substrate for a display device wherein a plurality of row electrode lines and a plurality of column electrode lines are arranged in a matrix form on a substrate;

a pixel electrode and a pixel-drive-TFT having a polycrystalline semiconductor channel are provided so as to correspond to each intersection of the row electrode lines and the column electrode lines;

the pixel-drive-TFTs are arranged in a line-like form in at least the direction of row electrode line;

row signals are supplied through the row electrode lines to the pixel-drive-TFTs; and column signals are supplied through the column electrode lines to the pixel-drive-TFTs, the substrate being characterized in that a plurality of column driver circuits for supplying column signals are formed on the substrate so as to correspond to the column electrode lines;

the row driving circuits have respectively at least one column-drive-TFT;

the column-drive-TFT has a polycrystalline semiconductor channel; and a plurality of the column-drive-TFTs selected by one or more from column driver circuits of different columns are arranged in a line-like form in substantially parallel to the direction of row electrode line.

As a third embodiment of the present invention, there is provided a substrate for a display device wherein a plurality of row electrode lines and a plurality of column electrode lines are arranged in a matrix form on a substrate;

a pixel electrode and a pixel-drive-TFT having a polycrystalline semiconductor channel are provided so as to correspond to each intersection of the row electrode lines and the column electrode lines;

the pixel-drive-TFTs are arranged in a line-like form in at least the direction of row electrode line;

row signals are supplied through the row electrode lines to the pixel-drive-TFTs; and column signals are supplied through the column electrode lines to the pixel-drive-TFTs, the substrate being characterized in that a plurality of row driver circuits for supplying row signals are formed on the substrate so as to correspond to each of the row electrode lines;

each of the row driver circuits has at least one row-drive-TFT;

the row-drive-TFT has a polycrystalline semiconductor channel;

the row-drive-TFT is arranged in a line-like form in the direction of row electrode line with respect to the pixel-drive-TFTs for a single row electrode line, and is made correspondence to the column electrode line;

a plurality of column driver circuits for supplying column signals are formed on the substrate;

the row driver circuits have respectively at least one column-drive-TFT;

the column-drive-TFT has a polycrystalline semiconductor channel; and a plurality of the column-drive-TFTs selected by one or more from column driver circuits of different columns are arranged in a line-like form in substantially parallel to the direction of row electrode line.

As a fourth embodiment of the present invention, there is provided a method of making a substrate for a display device which comprises:

forming an amorphous semiconductor layer on a substrate;

irradiating beam spots on the amorphous semiconductor layer;

scanning linearly the beam spots at scanning speed $\geq 10$ m/s;

beam-annealing for polycrystallization the amorphous semiconductor layer to form a polycrystalline semiconductor layer;

forming stripes in the polycrystalline semiconductor layer;

forming semiconductor islands in the stripes; and forming polycrystalline semiconductor channels for a pixel-drive-TFT, a row-drive-TFT and a column-drive-TFT in the semiconductor islands.

As a fifth embodiment of the present invention, there is provided a substrate for a display device wherein for the substrate of either one among the first, the third and the fourth embodiments, row-drive-TFTs are used as output buffers which directly drive row electrode lines, and first CMOS inverters having a channel width $nCH_d$ of n channel of 50 μm–500 μm and a channel width $pCH_d$ of p channel whose dimension is 1–10 times as large as $nCH_d$ are provided. Specifically, TFTs are used as final output buffers which directly drive the row electrode lines and supply a high electric current. The final output buffers having a channel length of 6 μm–7 μm ($nCH_d=50$ μm and $pCH_d=50$ μm) can supply an electric current of about 0.5 mA although it depends on the density of pixels and the number of pixels. In this case, a display of 3 inches and 320×240 pixels can be driven at a refresh rate of 60 Hz.

Further, under the condition of $nCH_d=500$ μm and $pCH_d=5000$ μm, an electric current of about 10 mA can be supplied. In this case, a display of 12 inches and 1280×1024 pixels can be driven at a refresh rate of 70 Hz.

In the substrate for a display device of the fifth embodiment, it is preferable to dispose second CMOS inverters having a channel width of $nCH_d$ of n channel of 5 μm–250 μm and a channel width $pCH_d$ of p channel whose dimension is 1–10 times as large as $nCH_d$, at the front stage for driving the first CMOS inverters. By combining the both inverters, a high driving performance is preferably obtainable.

As a sixth embodiment of the present invention, there is provided a substrate for a display device wherein for the substrate in either one among the second, the third and the fourth embodiments, column-drive-TFTs are used as output buffers which directly drive the column electrode lines, and first CMOS inverters having a channel width $nCH_d$ of n channel of 20 μm–100 μm and a channel width $pCH_d$ of p channel whose dimension is 1–3 times as large as $nCH_d$, or output buffers having a channel width $nCH_d$ of n channel of 20 μm–100 μm are provided.

Further, in the substrate of the sixth embodiment, when the TFTs having a longer channel width are provided, the column-drive-TFT is divided into plural TFTs to drive in parallel. Specifically, 2–6 column-drive-TFTs, preferably 2–3 column-drive-TFTs are provided for a single column electrode line so that the column electrode line is driven in parallel. Thus, the TFTs can be disposed in pitch gaps in the direction of column electrode line (i.e., in the dimension of the pixel electrodes in the direction of column electrode line).

In the present invention, the pixel-drive-TFTs and the row-drive-TFTs are arranged in a line-like form. Further, design of the column driver circuits are so made that at least a part of the semiconductor active layers for the column-drive-TFTs is formed in a single linear line in the direction of row electrode line, or all the semiconductor active layers are formed in plural linear lines.

BRIEF DESCRIPTION OF DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF PREFERRED EMBODIMENTS

Figure 1:
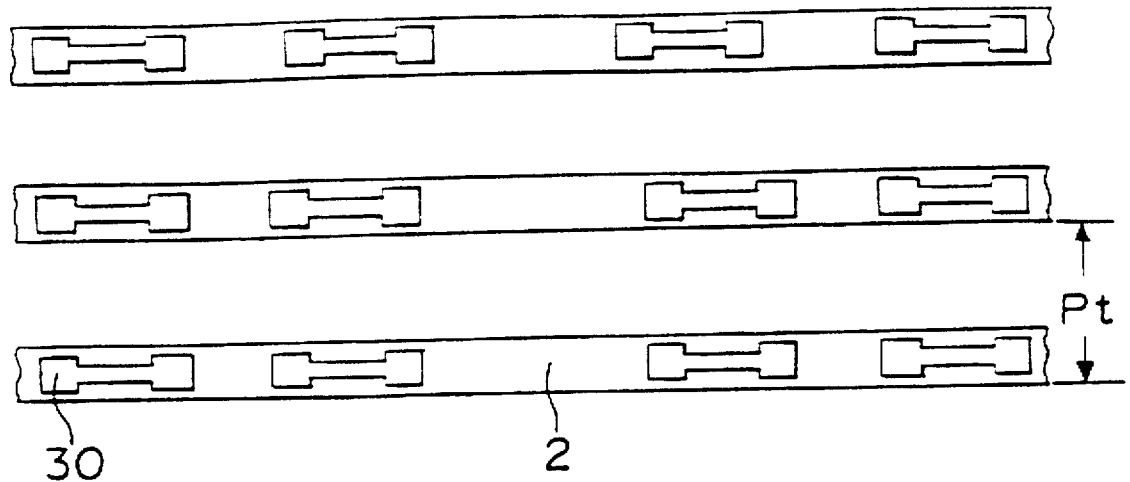
FIG. 1 is a plane view showing Si islands for column driver circuits arranged in a line-like form according to an embodiment of the present invention.

Preferred embodiments of the present invention will be described with reference to the drawings wherein the same reference numerals designate the same or corresponding parts.

FIG. 1 shows the relation of Si islands 30 for TFTs in driver circuits which are arranged in a line-like form and stripe-like polycrystalline layers 2 (i.e., stripes 2) obtained by beam-anneal-scanning wherein portions having an H-like letter are Si islands 30. The width of the stripes 2 is about 30 µm–100 µm, preferably about 40 µm–60 µm. The width of the stripes 2 depends on the power of a laser light source used and stability in the shape of the beam spot. On the other hand, the size of the polycrystalline semiconductor channel, when it is formed vertically to the stripes 2, is 4 µm–10 µm (e.g. 4 µm, 7 µm) although it depends on the margin and the SD region of the contact hole and the accuracy of photolithography.

Figure 7:
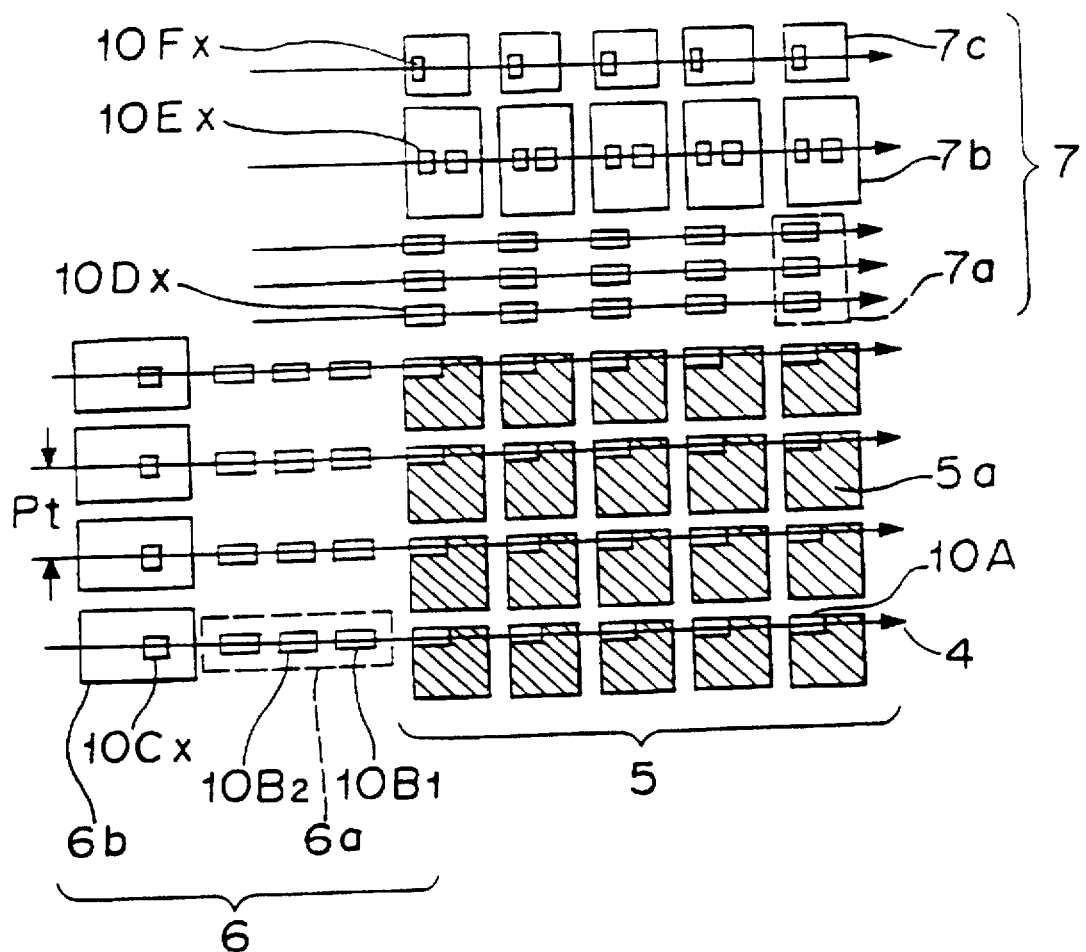
FIG. 7 is a plane view of the TFT substrate according to the present invention, which includes row driver circuits, column driver circuits and a pixel region.

An example of the substrate for display device of the present invention having row driver circuits and column driver circuits is shown in a plane view of FIG. 7 wherein there are shown a pixel region 5 in which pixel electrodes 5a and pixel-drive-TFTs 10A are arranged in a matrix form, column driver circuits 7 constituted by column-drive-output-buffers 7a, column-drive-sample-hold circuit 7b and column shift resistors 7c, and row driver circuits 6 including row-drive-output-buffers 6a and row shift resistors 6b. Each of the circuits has row-drive-TFTs 10B1, 10B2 ... 10Cx ... and column-drive-TFTs 10Dx ..., 10Ex ..., 10Fx ... These TFTs are arranged in a substantially line-like form in the direction parallel to the row electrode lines.

A numeral 4 designates a line for beam-anneal-scanning for forming polycrystalline Si layers by laser annealing. In FIG. 7, the laser annealing is repeatedly conducted with a predetermined pitch Pt in a fixed direction of the substrate. The pitch is preferably 50 µm or more although it depends on the size of pixels. The pitch Pt for the beam annealing is preferably Pt>the width of a stripe in consideration of preventing reduction in the characteristics at the overlapping portion of adjacent stripes.

From the viewpoint of the throughput, it is preferable that Pt>the width of a stripe×2. The pitch Pt may be changed in a relation to the driver circuits. Further, the beam-annealing may be conducted in a reciprocating manner. When the dimension of pixels in the direction of row electrode line is $L_{row}$, Pt×M=$L_{row}$ (M is an integer).

In the present invention, the row-drive-TFTs indicate TFTs arranged in the row driver circuits to form the circuits. In the same manner, the column-drive-TFTs indicate TFTs arranged in the column driver circuits to form the circuits. In particular, the size of the TFTs is not limited but it is sufficient if they function to drive-column signals and row signals.

EXAMPLE 1

Figure 3:
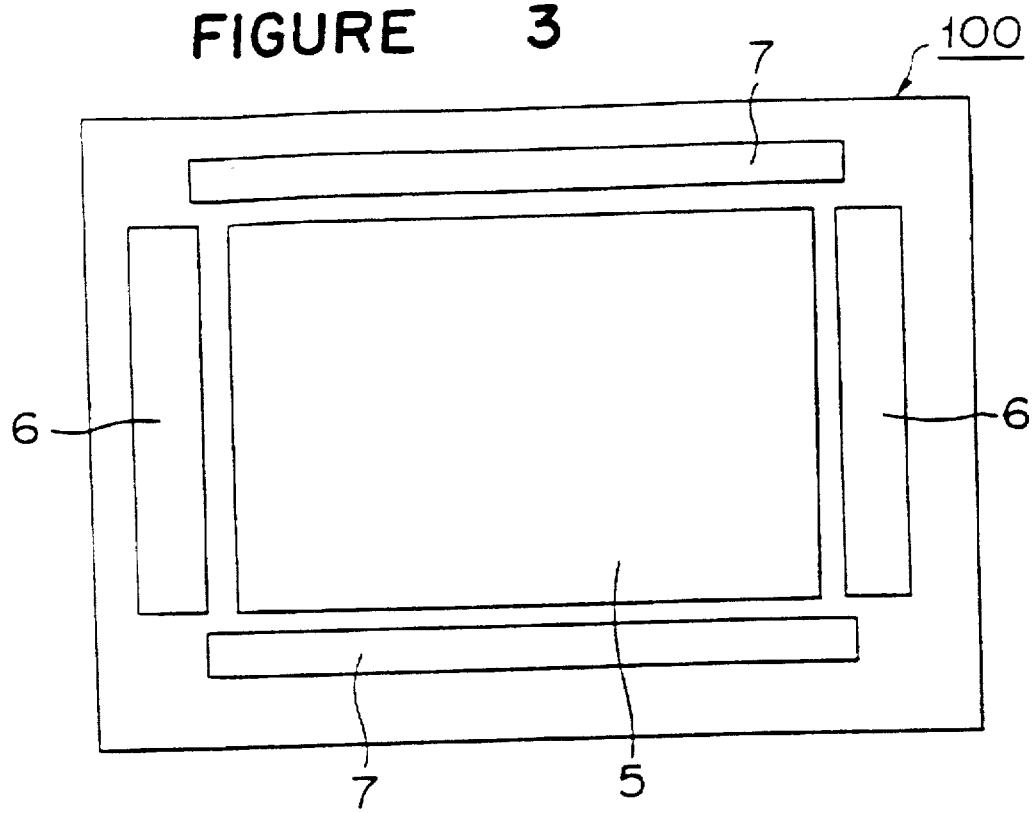
FIG. 3 is a plane view for a TFT substrate for a liquid crystal display device according to the present invention.

FIG. 3 is a plane view of a TFT substrate 100 for a liquid crystal display device wherein a pixel region (a pixel display matrix circuit) 5, row driver circuits 6 and column driver circuits 7 are formed on a glass substrate.

In the pixel region 5, switching transistors such as TFTs having polycrystalline semiconductor channels, pixel electrodes, row electrode lines (gate bus lines) and column electrode lines (source bus lines) are arranged in a matrix form. In this Example, Si is used as semiconductors. In FIG. 3, the row driver circuits 6 and the column driver circuits 7 are disposed at both sides so as to interpose the pixel region 5 therebetween.

Usually, they are divided into sets by an odd number and an even number and are disposed at the upper and lower sides and/or the left and right side around the pixel region.

TFTs are periodically turned on with row signals (scanning signals) supplied from the row driver circuits 6 through the row electrode lines, and column signals (data signals) supplied from the column driver circuits 7 through the column electrode lines are addressed in pixel electrodes. A liquid crystal layer, which is interposed between the glass substrate and a counter substrate (not shown), is driven by signal voltages addressed in the pixel-electrodes.

Each of the row driver circuits 6 has a shift resistor and row output buffers to treat the row signals. Each of the column driver circuits 7 has various circuits such as shift registers, data registers, latches, level shifters and output buffers (in a case of a digital circuit), or various circuits such as shift registers, level shifters, sample-hold and output buffers (in a case of an analog circuit) so as to supply the column signals.

Figure 4:
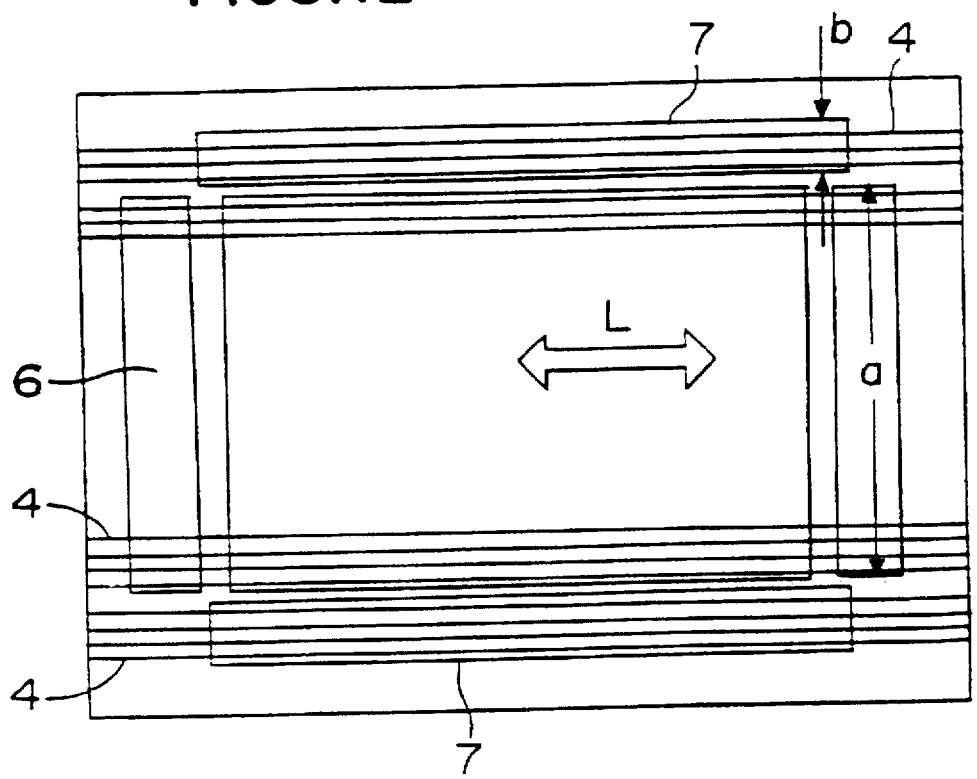
FIG. 4 is a plane view showing a method of preparing a substrate according to the present invention wherein beam-annealing is conducted linearly in the entire surface of a glass substrate.

The semiconductor layers (channels, sources and drains) of these TFT circuits are composed of polycrystalline Si which is formed by beam-annealing α-Si formed on the glass substrate with use of a scanning type beam anneal device. FIG. 4 is a plane view showing how to scan for beam-annealing the glass substrate as shown in FIG. 3. Beam-anneal-scanning lines 4 indicated by solid lines show that the beam-annealing is conducted over the glass substrate but intermittently.

The scanning for beam-annealing is conducted in the direction of row electrode line (in the direction of an arrow mark L in FIG. 4). For the beam-annealing, it is sufficient to use beams having an energy level which can polycrystallize a non-single crystalline film such as hydrogenated α-Si as an object for irradiation at a high speed with use of a continuous wave argon ion laser or the like. In this Example, an argon ion laser is used wherein the laser output power is 10 W, the diameter of beam spot is 100 µm (which generally corresponds to energy having a magnitude of $1/e^2$ of the peak strength) and the line speed for scanning is 13 m/s.

In beam-annealing the glass substrate over a range having a width as shown in FIG. 4, the structure of each of the row driver circuits 6 is so formed that the transistors in the row driver circuit 6 are disposed on the same line as the transistors for picture display. Accordingly, material in a predetermined region (specifically, hydrogenated α-Si) which is to be formed as TFTs in the pixel region 5 can be annealed together with the TFTs of the row driver circuit 6. The scanning for beam-annealing is conducted at a pitch which is substantially equal to the pitch of the pixels in the direction of row electrode line.

Further, the annealing can be conducted at a pitch of 1/M (M is an integer) of the pitch of the pixels in the direction of row electrode line. The pitch can be changed during the annealing. However, it is preferably effective to use a constant pitch in order to maintain accuracy of position.

When the number of times of beam-annealing for the region of the row driver circuits 6 is more than the number of the row electrodes for the pixels, it is possible to arrange the circuits using TFTs in an extra number of anneal lines (stripes 2) which is exceeding the number of the row electrodes.

In the area having a width b shown in FIG. 4, material (actually, hydrogenated α-Si) in a predetermined region which is to be formed as TFTs in the column driver circuits 7 can not be beam-annealed together with the TFTs of pixel display. However, in this Example, an arrangement is previously so made that the predetermined region in which the semiconductor channels of TFTs are formed has predetermined pitches in the direction of column electrode line, and are on straight lines having a predetermined width which extend in the direction of row electrode line.

Accordingly, the number of times of beam-anneal-scanning is equal to the number of the straight lines. The pitch for the beam-anneal-scanning corresponds to the pitch of the straight lines. However, the pitch may not be constant and the distance between specified adjacent two straight lines is different from the distance between other two straight lines. The arrangement of a constant pitch further contributes improvement in the throughput and stability.

The pitch of straight lines in a predetermined region for the TFTs of the column driver circuits may not be always constant, but may be changed optionally to meet the size of the TFTs and an arrangement of circuits. In other words, the TFTs should be arranged in a line-like form. Since the circuits are formed substantially symmetrically in the direction of row electrode line or column electrode line, the circuits are formed symmetrically even in the direction of row electrode line in the column driver circuits. However, when the pitch of the TFTs in the column driver circuits 7 is substantially the same as the pitch of the TFTs in the row driver circuits 6 (and the pixel region 5), a preferable result is obtainable in the treatment of the substrate, in improving the throughput and the overall accuracy of position of the stripes 2.

Specifically, it is necessary to arrange the components of the circuits on the straight lines (beam-anneal-scanning lines to form the stripes) having a substantially the same width as that of the beam spot since the beam-anneal-scanning is effected by laser beam. The width of the beam spot may be determined in consideration of the distortion in the locus of scanning lines and permissible error during the beam-anneal-scanning.

In this Example, the pitch of the beam-anneal-scanning lines was determined to be 120 μm in the column driver circuits and the pixel region (including the row driver circuits). The mobility of the obtained polycrystalline semiconductor layers (polysilicon) was about 40–50 cm$^2$/V·sec. Variation in the plane of the substrate at the regions forming the column driver circuits, the pixel region and the row driver circuits was about 5% or less, which showed remarkable improvement in comparison with the conventional technique.

EXAMPLE 2

A TFT substrate having a co-planer type polycrystalline Si TFTs wherein row driver circuits were integrated on a substrate on which pixel-drive-TFTs were formed, was prepared. The TFT substrate had 384 (H)×288 (V) in the number of pixels and a RGB stripe arrangement of 192 μm in pixel pitch. The substrate can be used for a full-color liquid crystal display device.

First, an α-Si layer having a thickness of 100 nm was formed on a glass substrate by a plasma CVD method. The α-Si layer was subjected to beam-annealing for polycrystallization by the above-mentioned high-speed-laser-anneal method. The beam-anneal-scanning was conducted in the direction of substantially parallel to the row electrode lines. The scanning pitch was 192 μm which was equal to the pitch of the row electrode lines, namely, the pitch of the TFTs in the pixel region in the direction of row electrode line. By the beam-annealing, stripes each having a width of about 50 μm were formed in the α-Si layer.

Figure 5:
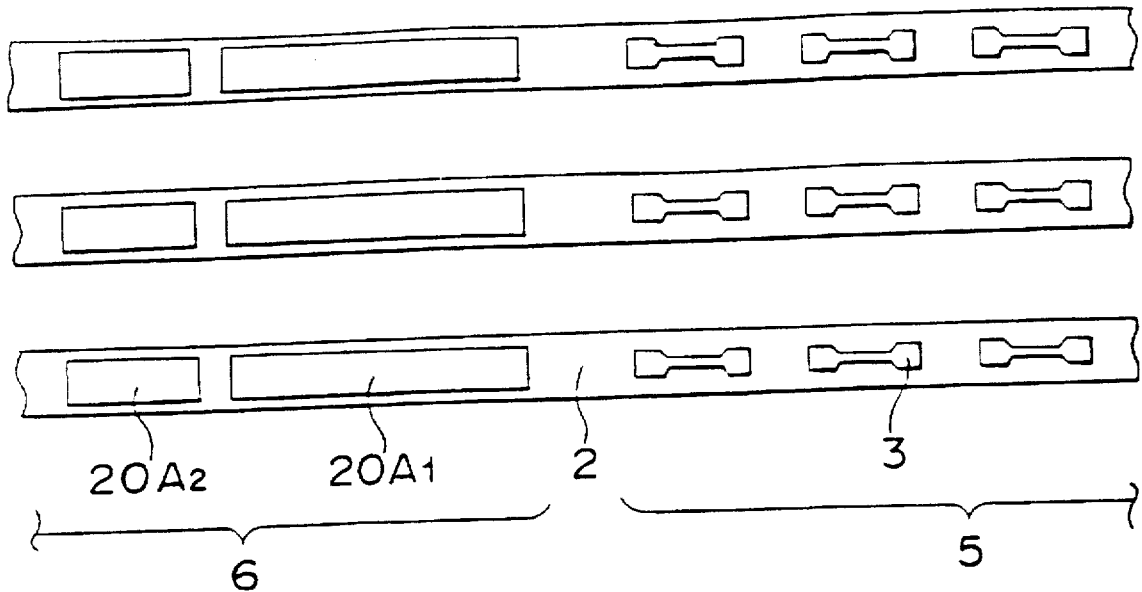
FIG. 5 is a plane view showing Si islands for row driver circuits arranged in a line-like form according to an embodiment of the present invention.

Next, the stripes were patterned by photolithography and etching to form silicon islands for the semiconductor channels (and the sources and drains) of the TFTs. FIG. 5 shows the positional relation between the silicon islands for the semiconductor channels of the pixel-drive-TFTs constituting switching elements for the pixels and the row-drive-TFTs. As in FIG. 5, first silicon islands 3 for the semiconductor channels of the pixel-drive-TFTs and second silicon islands 20A$_1$, 20A$_2$ (there are other silicon islands although the drawing omits them) for the semiconductor channels of the row-drive-TFTs were arranged in line-like forms so that they were included in each of the stripes polycrystallized by the beam-annealing.

The number of scanning lines for the beam-annealing to anneal the pixel region and the row driver circuits was 288 which was the same as the number of rows in the matrix of the TFTs. The silicon islands for large power TFTs among the row-drive-TFTs are elongated in the direction of the channel width. Accordingly, the longitudinal direction of each of the silicon islands was disposed so as to be vertical to the row electrode lines (or, the channel width direction was substantially in parallel to the row electrode lines) so that the stripes 2 could be used effectively.

Figure 6:
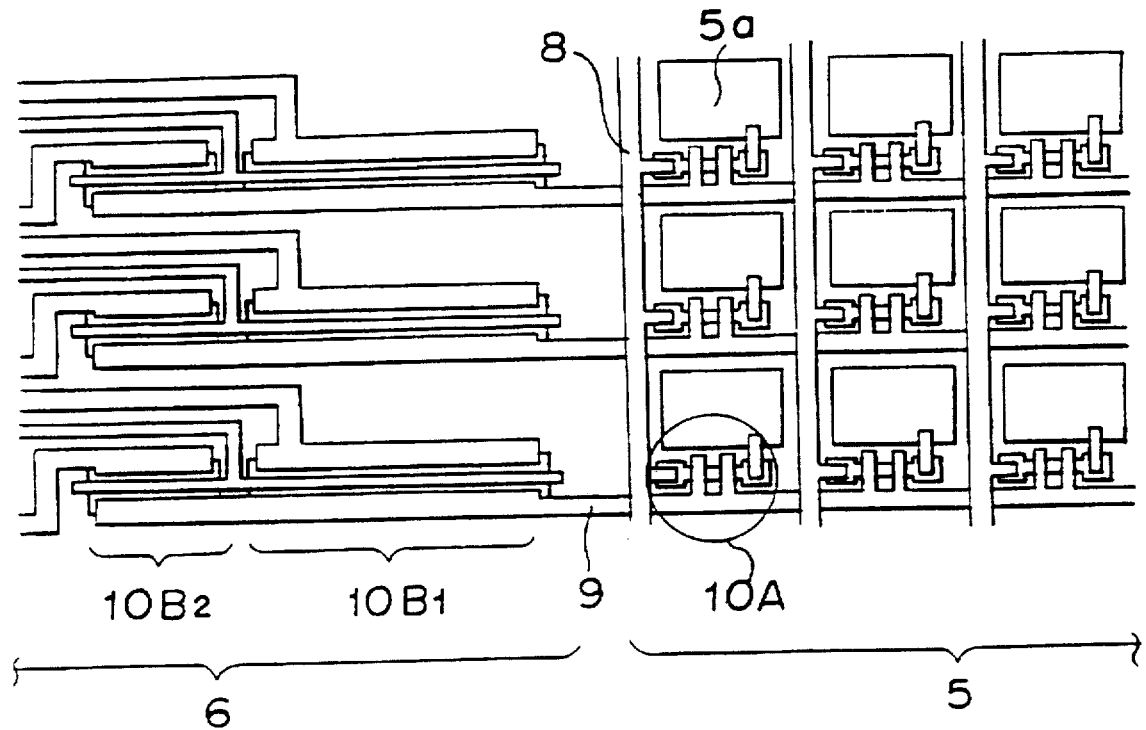
FIG. 6 is a plane view showing a pixel region and a part of row driver circuits arranged in a line-like form according to an embodiment of the present invention.

Further, the silicon islands for the pixel-drive-TFTs are arranged so that the longitudinal direction of the channels are in parallel to the row electrode lines. Then, the TFT substrate for display device was prepared by repeating the film formation of insulation films and electrodes, and patterning and so on. FIG. 6 shows a part of the pixels and the row driver circuits prepared by using the silicon islands shown in FIG. 5 (FIG. 6 is drawn with the same scale as FIG. 5).

In FIG. 6, a numeral 10A designates a pixel-drive-TFT, a numeral 5a a pixel electrode, a numeral 8 a column electrode line, a numeral 9 a row electrode line, numerals 10B$_1$ and 10B$_2$ designate row-drive-TFTs. The row-drive-TFTs 10B$_1$, 10B$_2$ constitute a CMOS inverter which is a final output stage buffer (row output buffer) for supplying row signals to the row electrode line 9. The width of the semiconductor channel is made large to obtain a necessary driving current.

In this Example, the second CMOS inverter (omitted in the Figure although it is adjacent to the row-drive-TFT 10B$_2$) having an n channel width of 50 μm and a p channel width of 400 μm and the first CMOS inverter (the row-drive-TFT10B$_2$ and the row-drive-TFT10B$_1$) were formed whereby row signals of about 5 mA could be supplied to the row electrode line 9. The structure shown in FIG. 5 and 6 was sufficient to drive the pixel region 5 by using a vertical scanning frequency of 60 Hz and a horizontal scanning frequency of 31.5 KHz. The channel length was about 7 μm.

EXAMPLE 3

A TFT substrate having the same construction as the above-mentioned Examples except that TFTs in the row shift resistors in the row driver circuits were formed by using the polycrystalline Si layers in the stripes 2 so that the TFTs were arranged in parallel to the direction of the row electrode lines. In this case, the channel length was 5–6 μm and the channel width was about 7–80 μm.

In the following, main steps for making the substrate for display device and the TFT display element according to the present invention are shown in Table 1. In the Table, the step number 11 (cutting and separation of the substrate) is used when a plurality of TFT substrates are produced.

TABLE 1

| No. | Step | Conditions material, process |
|---|---|---|
| 1 | Forming of α-Si layer | Plasma CVD, 300° C., 100 nm |
| 2 | High speed laser annealing (polycrystallization of the α-Si layer at Ta = room temp.) | SiNx (50 nm)/α-Si (100 nm)/SiOx (200 nm)/glass substrate |
| 3 | Patterning of Si island | Photolithography, etching |
| 4 | Forming of gate insulating layer | Plasma CVD |
| 5 | Forming of column electrode | Cr sputtering |
| 6 | Impurity implantation into Source/Drain | Ion implantation |
| 7 | Forming of interlayer (dielectric) | Plasma CVD |
| 8 | Forming of pixel electrode | Sputtering, ITO |
| 9 | Forming of source/drain electrode lines | Sputtering: Cr, Al |
| 10 | Forming of protective overcoat layer | Plasma CVD |
| 11 | Cutting and separation of large size substrate | |
| 12 | TFT display element: | major substeps ①spreading spacer ②edge sealing, ③forming cell, ④pouring LC material into cell |

In the next, several Comparative Examples will be described in which TFT substrates were prepared by using a conventional technique in the same manner as the above-mentioned Examples.

COMPARATIVE EXAMPLE 1

Figure 10:
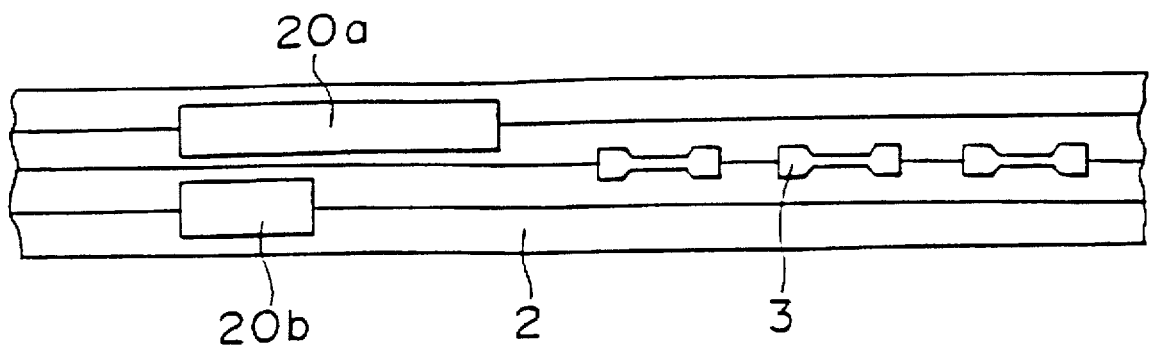
FIG. 10 is a plane view showing a conventional technique wherein Si islands for column driver circuits are arranged in a non-linear form.

The construction of a TFT substrate is the same as those of the Examples except for the arrangement of TFTs and the annealing step. The arrangement of silicon islands for the semiconductor channels of pixel-drive-TFTs and row-drive-TFTs is shown in FIG. 10. The silicon islands 3 for the pixel-drive-TFTs are arranged in a line-like form. However, silicon islands 20a, 20b for row-drive-TFTs are not on the extension line of the silicon islands 3 arranged in a line-like form, but they are bridged on adjacent two stripes. Accordingly, it is necessary to conduct beam-anneal-scanning at a pitch of 48 μm without leaving spaces so that all the silicon islands for the row-drive-TFTs are polycrystallized. In this case, the number of scanning lines for beam-annealing to anneal the display device region and the row driver circuits is four times as the number of rows in the matrix of the TFTs, i.e., 1152.

EXAMPLE 4

In this Example, the positional relation of groups of silicon islands for the semiconductor channel portions of pixel-drive-TFTs and row-drive-TFTs is the same as that shown in FIG. 5. In this Example, the silicon islands are used so that row driver circuits are connected to the pixel region by shifting one line in the positional relation where the beam-annealing is conducted, namely, a row signal from the (n)th row driver circuit is connected to the (n±1) row electrode line.

In Example 2, the pixel-drive-TFTs belonging to a specified row are arranged on the same line as the row-drive-TFTs corresponding to the specified row. However, in this Comparative Example, the pixel-drive-TFTs in the (n)th row are arranged on the same line as the row-drive-TFTs in the (n±1) row. In this case, the number of scanning lines for beam-annealing necessary to form the TFT substrate having 288 rows is 289.

This Example is preferable in a case that the pixel-drive-TFTs are shifted by one row with respect to the row-drive-TFTs when there are restrictions in patterning of layers other than the semiconductor layers and the layout of the elements.

EXAMPLE 5

A TFT substrate was prepared by forming TFTs in polycrystalline Si layers on a substrate and by integrating row driver circuits and column driver circuits on the same substrate.

Figure 8:
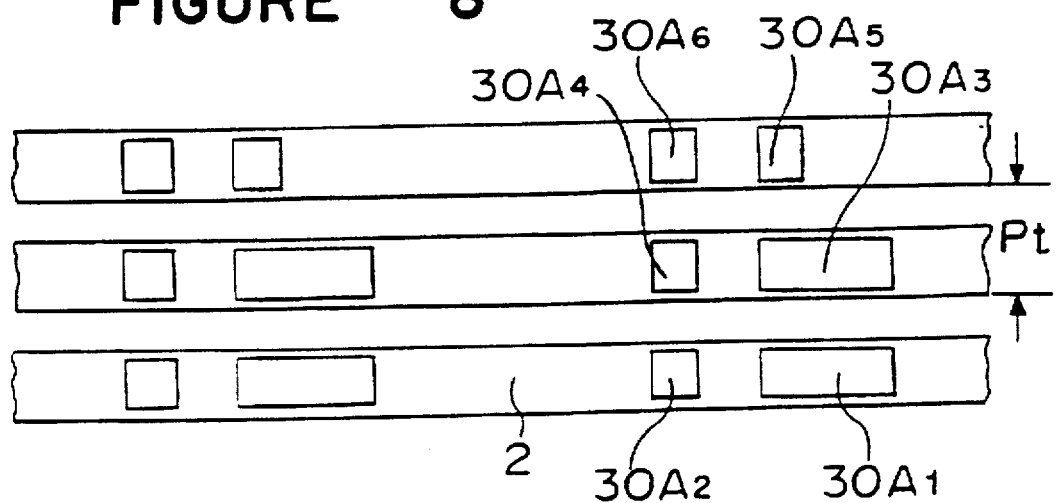
FIG. 8 is a plane view showing an embodiment of Si islands for a part of column driver circuits arranged in a line-like form.

In the same manner as Example 2, an α-Si layer is polycrystallized by a high speed laser anneal method, and silicon islands are formed by patterning. FIG. 8 shows an example of the arrangement of the silicon islands for the semiconductor channel portions of column-drive-TFTs. The scanning pitch Pt for the beam-annealing was 96 μm. The silicon islands $30A_1$, $30A_2$, $30A_3$, $30A_4$, $30A_5$ and $30A_6$ of the column-drive-TFTs were arranged in a line-like form so that they are in polycrystallized stripes 2 and on a plurality of lines parallel to the row electrode lines.

The number of scanning lines for the beam-annealing necessary to polycrystallize the silicon islands of the column-drive-TFTs is 120. Since the shape of the silicon islands of the column-drive-TFTs is elongated in the direction of the channel width in the same manner as that of the row-drive-TFTs, they are arranged so that the longitudinal direction of the channels is vertical to the row electrode lines so that the stripes, which are formed by polycrystallizing the α-Si layer by beam-annealing, can be used effectively.

Figure 9:
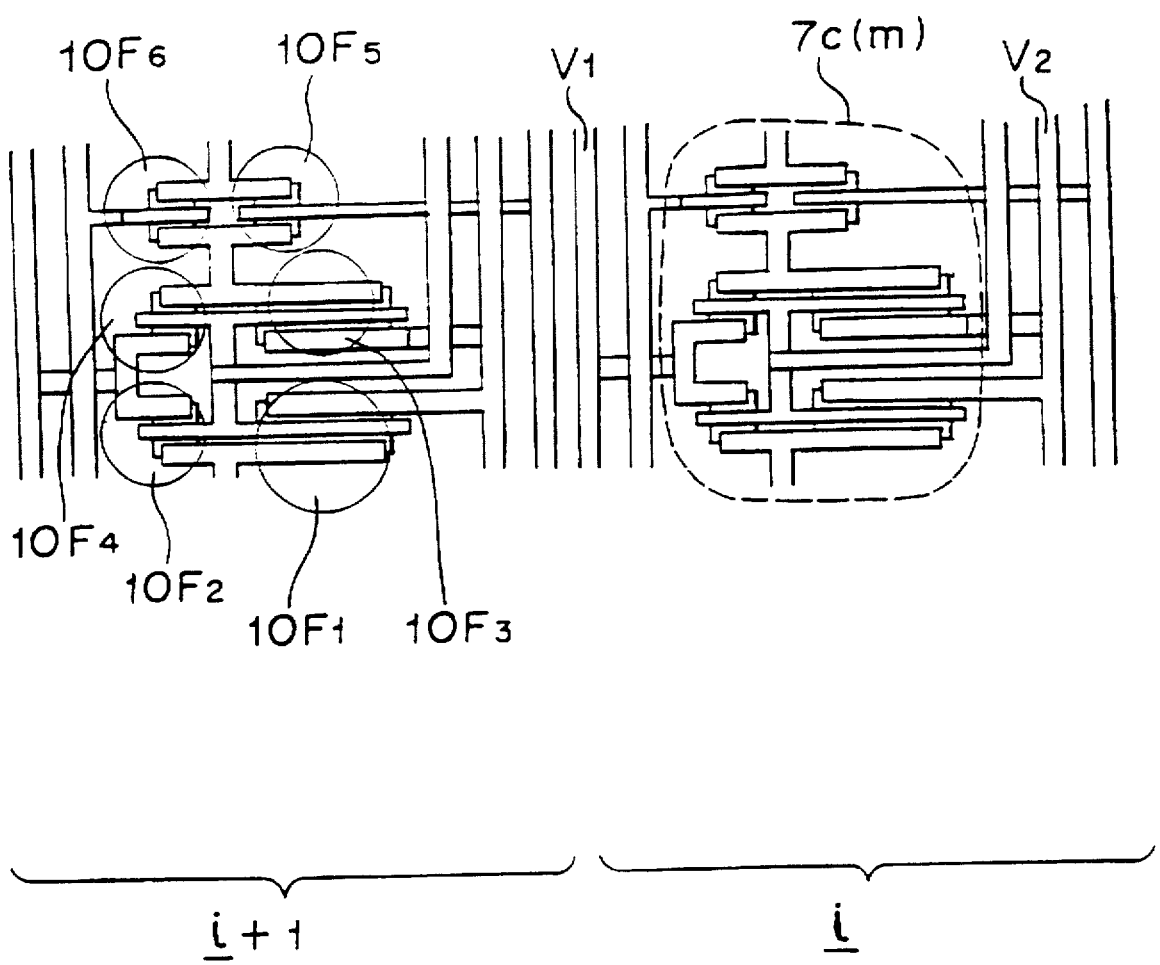
FIG. 9 is a plane view showing an embodiment of column driver circuits arranged in a line-like form.

FIG. 9 shows a part of column driver circuit formed of the silicon islands shown in FIG. 8. In FIG. 9, a part of a column shift resistor 7c (m) in a column driver circuit is shown. In FIG. 9, the adjoining (i+1) th and i th column driver circuits are shown.

Column-drive-TFTs $10F_1$, $10F_2$, $10F_3$, $10F_4$, $10F_5$ and $10F_6$ were formed. CMOS inverters are constituted by two pieces of the column-drive-TFTs in the same manner as the row driver circuits. Each of the CMOS inverters is located on the same stripe 2. $V_1$ and $V_2$ indicate power source lines for the TFTs. In FIG. 9, the detail of wiring such as steps, interlayer connection and so on is simplified.

In the next, another Comparative Example wherein a TFT substrate was made by using the conventional technique will be described.

COMPARATIVE EXAMPLE 2

Figure 11:
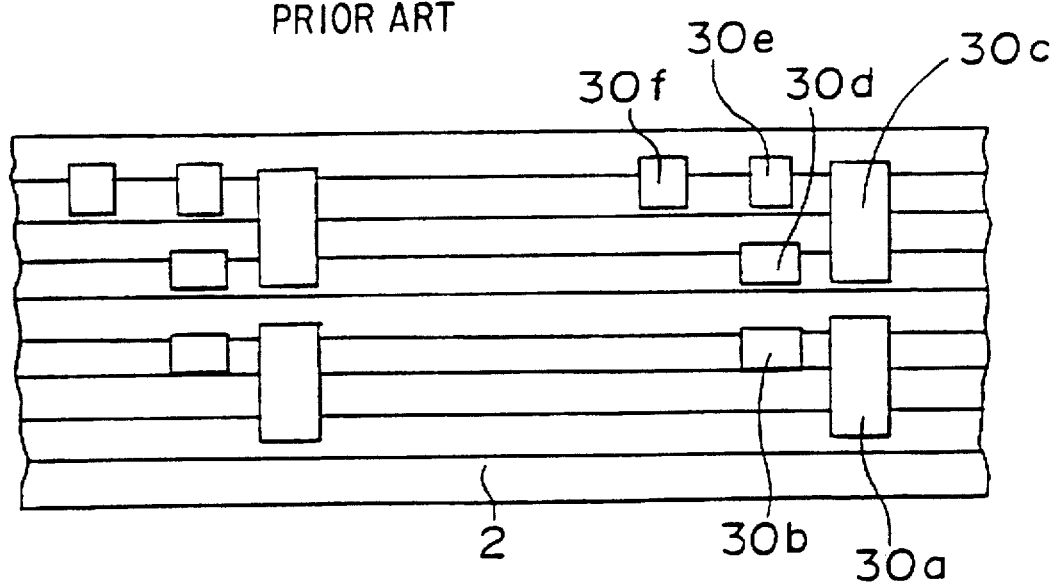
FIG. 11 is a plane view showing a conventional technique wherein Si islands for column driver circuits are arranged in a non-linear form.

FIG. 11 shows an arrangement of silicon island groups (30a, 30b, 30d, 30e and 30f) for the channel portions of the column-drive-TFTs. The arrangement of the silicon islands is not in a line-like form, but is mainly for easiness of patterning for connection. The beam-annealing for polycrystallizing the silicon island groups is made at a pitch of 48 μm without leaving any space between beam anneal lines. The number of scanning lines for beam-annealing necessary to polycrystallize the silicon islands of the column-drive-TFTs is 200.

In column driver circuits prepared by using the silicon islands shown in FIG. 11, a difference in characteristics between the column-drive-TFTs of each row is apt to appear, whereby irregularity in display characteristics is apt to cause among rows.

EXAMPLE 6

In the same manner as Example 5, a TFT substrate wherein row driver circuits and column driver circuits were integrated on the same substrate by using polycrystalline Si TFTs.

Figure 12:
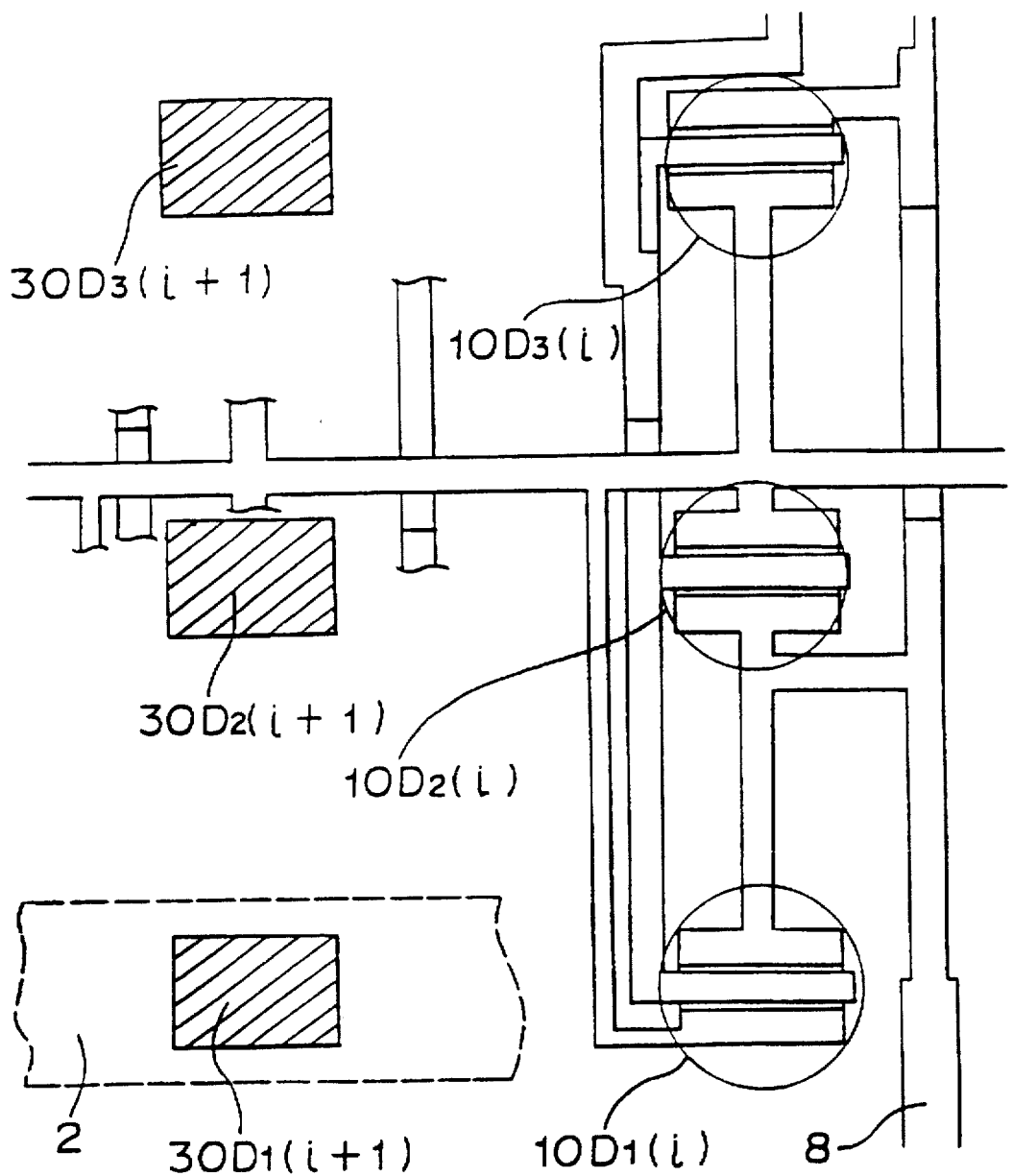
FIG. 12 is a plane view showing an example of column driver circuits (output buffers) arranged in a line-like form.

FIG. 12 shows an example of a column output buffer for the column driver circuits in this Example. In addition, the arrangement of silicon islands $30D_{1(i+1)}$, $30D_{2(i+1)}$ and $30D_{3(i+1)}$ for the semiconductor channels of the column-drive-TFTs is shown. The size of each of the silicon islands is about 40 μm×28 μm. The scanning pitch Pt for the beam-annealing were about 96 μm in column and pixel region, 192 μm in row region. Silicon islands were arranged in plural line-like forms which are in parallel to the row electrode lines and included in stripes 2 of the column-drive-TFTs.

The number of scanning lines for the beam-annealing necessary for the column driver circuits is 120. In this Example, the channel islands are arranged so that the channel length direction is perpendicular to the row electrode lines so as to obtain a driving current for the column-drive-TFTs, and three TFTs $10D_{1(i)}$, $10D_{2(i)}$ and $10D_{3(i)}$ are arranged in parallel to a single column electrode line (the ith row). In this case, the channel width is 120 μm in total. Accordingly, even if any one of the TFTs becomes faulty, it can be separated and the remaining active TFTs can be used for driving. The above-mentioned structure can be preferably used when the pixel density of a display is high.

EXAMPLE 7

A large-sized substrate was prepared for multi-annealing so that the substrate can be divided into a plurality of substrates for display device. Namely, a plurality of sets of row driver circuits and column driver circuits were integrated on the large-sized substrate wherein the circuits were composed of polycrystalline TFTs.

Figure 13:
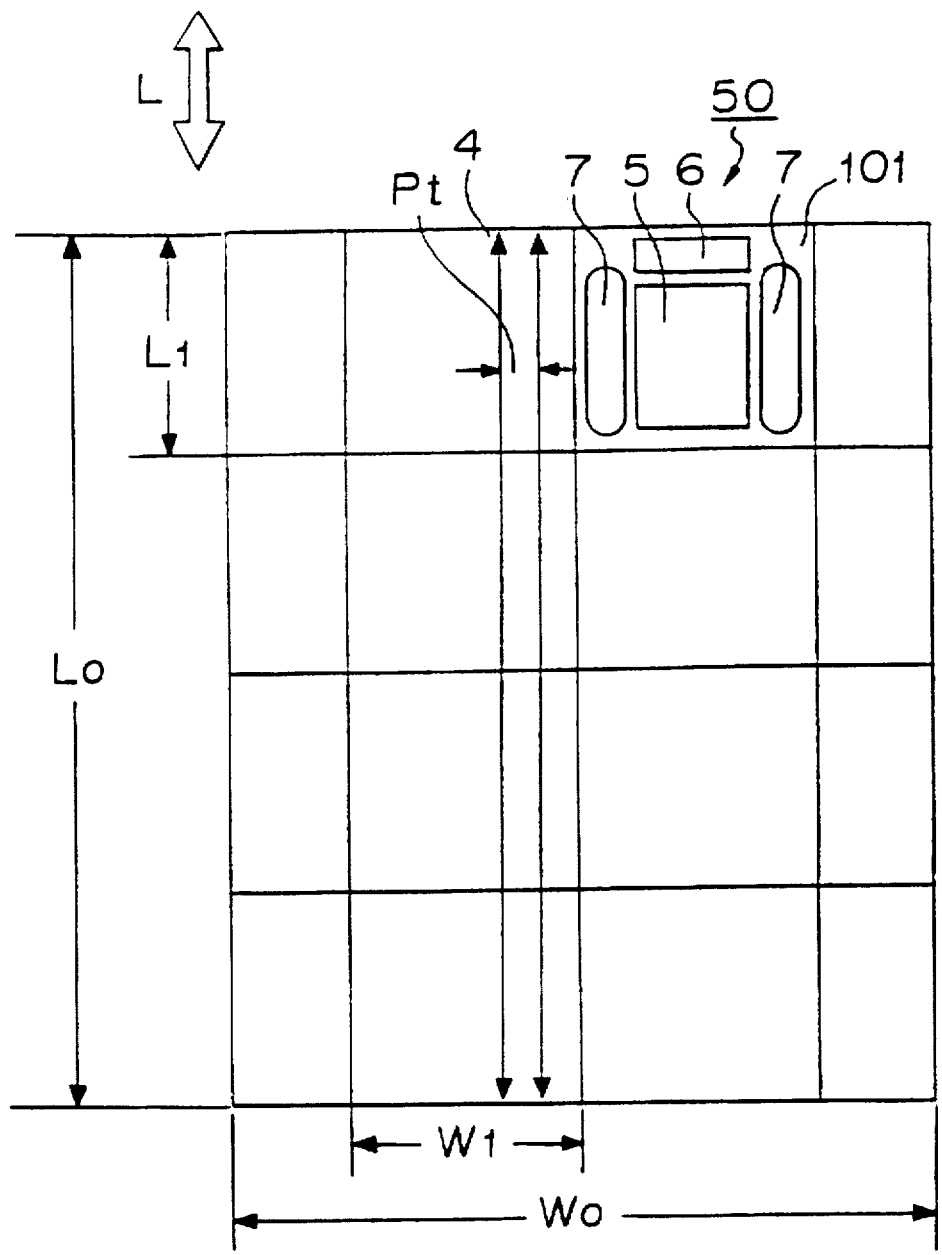
FIG. 13 is a plane view showing a large-sized substrate for multi-annealing obtained by the present invention wherein a plurality of TFT substrates can be taken from the large-sized substrate.

FIG. 13 shows an embodiment of this Example. A plurality of TFT substrates 101 can be obtained from a single large-sized substrate 50. The substrate prepared according to this Example further increases efficiency of production in comparison with a case that each TFT substrate is beam-annealed. The size of the large-sized substrate 50 was 400 mm (longitudinal side, Lo)×300 mm (lateral side Wo).

The dimensions of each of separated substrates 101 for display device was $L_1=W_1=100$ mm. The length of the diagonal line was 3.1 inches; the pixel region was composed of pixels of 640×480, and the longitudinal and lateral dimensions were about 64 mm×48 mm. The pitch Pt of the scanning lines for beam-annealing was 100 μm. The size of each of the substrates for display device was the same, and 8 substrates could be obtained from said large-sized substrate.

A time for the beam-annealing was about 2 minutes inclusive of an intermediate overhead time (beam-annealing operations are stepped or shifted for spaces between the substrates) wherein the line speed was about 13 m/s.

Multi-annealing system exhibits its superiority in a case that a plurality of panels for display devices are arranged in the direction of beam-annealing. Either direction of row or column can be selected so that the total number of beam annealing lines is minimized. Generally, the panels are arranged in the row direction for beam annealing. Since the scanning speed is high (such as 10 m/s or more), a time required for beam-annealing is not so much even though the length of annealing line is increased.

Table 2 shows an example combination of factors in a case that a glass substrate having a fixed size (450 mm×370 mm) is beam-annealed. The dimensions of the glass substrate can be further increased. For instance, multi-annealing can be conducted for a 1280(×3)×1024 substrate of high-precision and large size.

TABLE 2

| Application | Display layout (H×V) (a) | Pixel pitch (μm) | Display size (mm) | Output number of panels in annealing process (panels) (b) |
|---|---|---|---|---|
| Video projector | 640×480 | ~100 | 64×48 | ~25 <5x5> |
| Small data display | 320(x3) x240 | ~300 | 96×72 | 6–12 <3x2> <4x3> |
| Personal computer | 640(x3) x480 | 200–300 | 128~192 x96 x144 | 4–9 <2x2> <3x3> |
|  | 1024(x3) x768 | ~200 | 205×154 | 4 <2x2> |

Figure 14:
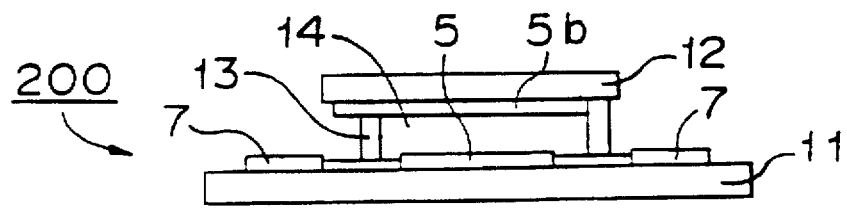
FIG. 14 is a cross-sectional view showing a TFT display element as a model.

Note
(a) : (x3) indicates triple dots for RGB full color.
(b) : Matrix <x> = The number in L direction x
        The number in D direction On each of the substrates for display device, counter substrates were provided to obtain TFT display elements 200. FIG. 14 is a cross-sectional view of the display element 200 wherein it is mainly composed of a glass substrate 11, a counter glass substrate 12, a peripheral seal 13, a liquid crystal layer 14, row driver circuits 7, a pixel region 5 and a counter electrode 5b.

The TFT display element 200 also has a peripheral driver circuit formed on the substrate 11 and constituted by TFTs provided with polycrystalline semiconductor channels.

The display element can be manufactured at a low cost and provides a stable picture image with little scattering. Further, since the peripheral circuit is formed integrally with the substrate, assembling operations can be simplified.

The configuration of Examples 1 through 7 described above are summarized in Table 3. (All examples are coplaner type TFTs.)

TABLE 3

| No. | Display layout | Pixel pitch (μm) | Circuit element or block designed in line-like configuration | | Scan pitch (μm) | Stripe width (μm) | Annealing lines |
|---|---|---|---|---|---|---|---|
| 1 | 640H 480V | 100 | row+ column | odd/even (divided) circuit | 120 | 50 | 40x2 +480 |
| 2 | 384H 288V | 192 | row | output-buffer | 192 | | 288 |
| 3 | | | row | shift register | 192 | | 288 |

TABLE 3-continued

| Display No. layout | Pixel pitch (μm) | Circuit element or block designed in line-like configuration | | Scan pitch (μm) | Stripe width (μm) | Annealing lines |
|---|---|---|---|---|---|---|
| 4 | | row | n => n±1 | 192 | | 289 |
| 5 | | row+ column | odd/even row-circuit, shift register | col 96 row 192 | | col 120 x2+ row 288 |
| 6 | | row+ column | odd/even row-circuit, col-parallel drive | col 96 row 192 | | col 120 x2+ row 288 |
| 7 | ⌈640H 480V⌋ x8 | 100 | row+ column | [2×4=8] multi-annealing; row-one sided, col-odd/even circuit | 100 | ⌈col 120 x2+ row 288⌋ x2 |

In the present invention, since TFTs for row driver circuits are arranged in plural line-like forms and TFTs for column driver circuits are arranged in plural line-like forms, the number of times of scanning for beam-annealing to the column driver circuits can be the number of plural lines. Accordingly, the number of times of the scanning for the beam-annealing can be remarkably reduced in comparison with a conventional arrangement of TFTs. Accordingly, the throughput in the manufacture of driver circuit assembling type TFT substrate is dramatically improved. In comparing the present invention with the conventional technique, the number of times of beam-anneal-scanning the same number of Si islands can be reduced from 7 to 3, for instance. As the number of lines is small, the number of times of scanning is small, and the throughput is further improved.

Figure 2:
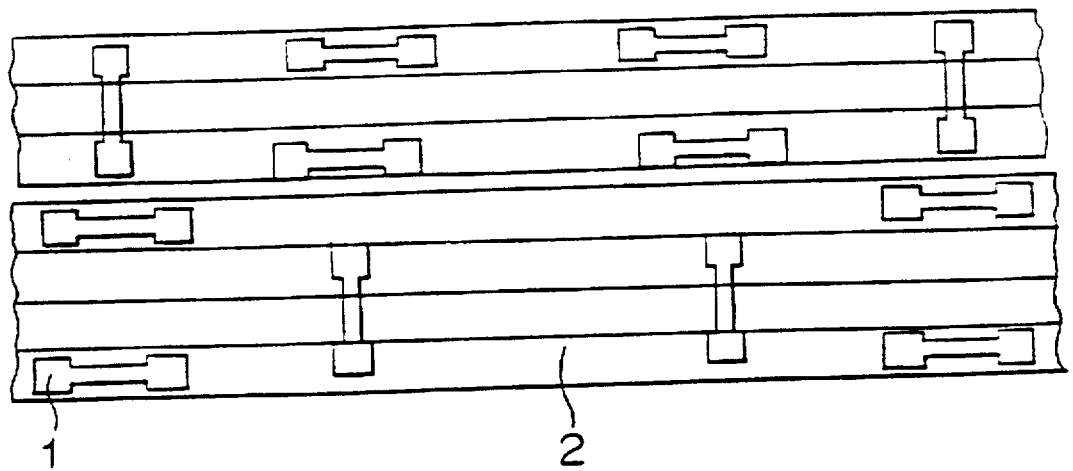
FIG. 2 is a plane view showing a conventional technique in which Si islands for column driver circuits arranged in a non-linear form.

In the present invention, design is so previously made that Si islands are in the scanning lines for beam-annealing, there is no possibility that, as shown in FIG. 2, the Si islands bridge a plurality of scanning lines for beam-annealing, whereby scattering in the transistor characteristics of the TFTs can be reduced. Accordingly, for comparison, when TFTs having the same size are used, the driver circuits are operable stably and at a high speed; and leaking of current can be reduced. Namely, the addressing speed of signals to the liquid crystal layer can be stable, and an excellent quality of display can be obtained in comparison with the conventional technique.

Further, since a plurality of substrates for display device can be obtained from a large-sized substrate, the effect of the present invention is further. For instance, 8–16 TFT substrates can be formed from a large-sized substrate, and a time for polycrystallization is only within 2–3 minutes. Further, the position of the polycrystalline Si layers (stripes) formed by the method of the present invention is previously determined, whereby alignment in manufacturing processes is good and yield is further improved.

Since a high speed beam-annealing method can be conducted at the room temperature, it is further advantageous in making large-sized substrate. Further, since there is no large hysteresis of of temperature, scattering in the characteristics of the final product can be reduced.

Further, since a cheeper glass substrate having a low melting point is used, the manufacturing cost is low.

Since the layout of pattern has regularity, it is easy to conduct tests during the manufacturing steps and repairing.

In the present invention, since TFTs are arranged in a line-like form, high productivity and yield can be obtained in the polycrystallization of an α-Si layer. Further, a substrate for a display device thus obtained provides a stable performance with little variation in the characteristics of the TFTs used as main circuit elements. Further, since the substrate for display can be made by using a low temperature process, the reliability of the substrate for display device can be improved.

Obviously, numerous modifications and variations of the present invention are possible in light of the above teachings. It is therefore to be understood that within the scope of the appended claims, the invention may be practiced otherwise than as specifically described herein.

What is claimed is:

1. A substrate for a display device wherein a plurality of row electrode lines and a plurality of column electrode lines are arranged in a matrix form on a substrate;

pixel electrodes and pixel-drive-TFTs, each having a polycrystalline semiconductor channel, are provided so as to correspond to each intersection of the row electrode lines and the column electrode lines;

the pixel-drive-TFTs are arranged in a line in at least the direction of said row electrode lines;

row signals are supplied through the row electrode lines to the pixel-drive-TFTs; and column signals are supplied through the column electrode lines to the pixel-drive-TFTs, the substrate being characterized in that a plurality of row driver circuits for supplying row signals are formed on the substrate so as to correspond to each of the row electrode lines;

each of the row driver circuits has at least one row-drive-TFT;

the row-drive-TFT has a polycrystalline semiconductor channel; and the row-drive-TFT is arranged in a line in the direction of said row electrode lines with respect to the pixel-drive-TFTs for a single row electrode line wherein the polycrystalline semiconductor channel of the row-drive-TFTs has a channel width of 50 μm–2000 μm and a channel length of 4 μm–8 μm.

2. The substrate for a display device according to claim 1, wherein either longer one between the channel width and the channel length of the polycrystalline channel of the row-drive-TFTs is arranged substantially parallel to the direction of said row electrode lines.

3. The substrate for a display device according to claim 2, wherein a CMOS inverter in which a channel width $nCH_d$ of n channel is 50 μm–500 μm and a channel width $pCH_d$ of p channel is 1–10 times as large as $nCH_d$ is provided as the row-drive-TFT in the row driver circuit.

4. The substrate for a display device according to claim 1, wherein the row driver circuit includes a shift register circuit having the row-drive-TFTs in which at least one of the row-drive-TFTs in the shift register is arranged in a line with respect to the pixel-drive-TFTs for a row electrode line.

5. The substrate for a display device according to claim 4, wherein all the row-drive-TFTs in the shift register are arranged in a line form with respect to the pixel-drive-TFTs for a row electrode line.

6. A substrate for a display device wherein a plurality of row electrode lines and a plurality of column electrode lines are arranged in a matrix form on a substrate;

pixel electrodes and pixel-drive-TFTs, each having a polycrystalline semiconductor channel are provided so as to correspond to each intersection of the row electrode lines and the column electrode lines;

the pixel-drive-TFTs are arranged in a line in at least the direction of said row electrode lines;

row signals are supplied through the row electrode lines to the pixel-drive-TFTs; and column signals are supplied through the column electrode lines to the pixel-drive-TFTs, the substrate being characterized in that a plurality of row driver circuits for supplying row signals are formed on the substrate so as to correspond to each of the row electrode lines;

each of the row driver circuits has at least one row-drive-TFT;

the row-drive-TFT has a polycrystalline semiconductor channel;

the row-drive-TFT is arranged in a line in the direction of said row electrode lines with respect to the pixel-drive-TFTs for a single row electrode line, a plurality of column driver circuits for supplying column signals are formed on the substrate so as to correspond to the column electrode lines;

the column driver circuits have respectively at least one column-drive TFT;

the column-drive TFT has a polycrystalline semiconductor channel; and a plurality of the column-drive-TFTs selected from column driver circuits of different columns are arranged in a line substantially parallel to the direction of said row electrode lines wherein the polycrystalline semiconductor channel of the row-drive-TFTs has a channel width of 50 μm–2000 μm and a channel length of 4 μm–8 μm.

7. The substrate for a display device according to claim 6, wherein at least one row-drive-TFT in the row driver circuit for each of the row electrode lines is arranged in a line-like form with respect to the pixel-drive-TFTs for a row electrode line, and a plurality of column-drive-TFTs selected by one or more from each of the column driver circuits for all the column electrode lines or for all the column electrode lines of one divided set of the column electrode lines are arranged in a line-like form in the direction of row electrode line.

8. The substrate for a display device according to claim 1, wherein a polycrystalline semiconductor layer is used for the polycrystalline semiconductor channel of the pixel-drive-TFTs and the polycrystalline semiconductor channel of the row-drive-TFTs wherein the polycrystalline semiconductor layer is formed by beam-annealing an amorphous semiconductor layer.

9. The substrate for a display device according to claim 6, wherein a polycrystalline semiconductor layer is used for the polycrystalline semiconductor channel of the pixel-drive-TFTs, the polycrystalline semiconductor channel of the row-drive-TFTs and the polycrystalline semiconductor channel of the column-drive-TFTs wherein the polycrystalline semiconductor layer is formed by beam-annealing an amorphous semiconductor layer.

10. A TFT display element comprising the substrate for a display device as defined in claim 1, a counter substrate having a counter electrode and a liquid crystal layer interposed between said substrate for said display device and said counter substrate.

11. A TFT display element comprising the substrate for a display device as defined in claim 6, a counter substrate having a counter electrode and a liquid crystal layer interposed between said substrate for said display device and said counter substrate.

* * * * *